United States Patent
Morimoto et al.

(10) Patent No.: US 8,040,062 B2
(45) Date of Patent: Oct. 18, 2011

(54) ELECTROCONDUCTIVE LAMINATE, AND ELECTROMAGNETIC WAVE SHIELDING FILM AND PROTECTIVE PLATE FOR PLASMA DISPLAY

(75) Inventors: Tamotsu Morimoto, Ichihara (JP); Hideaki Miyazawa, Ichihara (JP); Masahiro Fusen, Ichihara (JP); Koichi Kanda, Takasago (JP); Susumu Nakagama, Takasago (JP)

(73) Assignee: Asahi Glass Company, Limited, Tokyo (JP)

( * ) Notice: Subject to any disclaimer, the term of this patent is extended or adjusted under 35 U.S.C. 154(b) by 108 days.

(21) Appl. No.: 11/755,555

(22) Filed: May 30, 2007

(65) Prior Publication Data

US 2007/0224432 A1  Sep. 27, 2007

Related U.S. Application Data

(63) Continuation of application No. PCT/JP2005/020042, filed on Oct. 31, 2005.

(30) Foreign Application Priority Data

Nov. 30, 2004 (JP) .................. 2004-345877
Sep. 2, 2005 (JP) .................. 2005-254907

(51) Int. Cl.
  *H01J 17/49* (2006.01)
  *H01J 9/00* (2006.01)
(52) U.S. Cl. ........ 313/582; 313/586; 313/112; 313/110; 445/24; 427/126.5; 427/126.2; 427/126.3; 427/78
(58) Field of Classification Search .......... 313/582–587; 445/24–25; 427/126.1–126.5, 78
See application file for complete search history.

(56) References Cited

U.S. PATENT DOCUMENTS

| | | | |
|---|---|---|---|
| 4,996,105 A | 2/1991 | Oyama et al. | |
| 6,255,778 B1 | 7/2001 | Yoshikawa et al. | |
| 6,316,110 B1 * | 11/2001 | Anzaki et al. ................. | 428/432 |
| 6,452,331 B1 | 9/2002 | Sakurada et al. | |
| 6,638,326 B2 | 10/2003 | Small et al. | |
| 6,638,626 B2 | 10/2003 | Sakurada et al. | |
| 7,005,189 B1 | 2/2006 | Tachibana et al. | |

(Continued)

FOREIGN PATENT DOCUMENTS

CN   1269699 A   10/2000
(Continued)

OTHER PUBLICATIONS

U.S. Appl. No. 11/755,577, filed May 30, 2007, Morimoto et al.
(Continued)

*Primary Examiner* — Mariceli Santiago
(74) *Attorney, Agent, or Firm* — Oblon, Spivak, McClelland, Maier & Neustadt, L.L.P.

(57) ABSTRACT

Provided is an electroconductive laminate having a substrate and an electroconductive film formed on the substrate, wherein the electroconductive film has a multilayer structure having an oxide layer and a metal layer alternately laminated from the substrate side in a total layer number of (2n+1) (wherein n is an integer of at least 1); the oxide layer predominantly contains zinc oxide and titanium oxide having a refractive index of at least 2.3; the oxide layer has an atomic ratio of titanium to a total amount of titanium and zinc of 15-50 atomic %; and the metal layer predominantly contains silver or a silver alloy. Also provided is a process for producing the electroconductive laminate.

10 Claims, 4 Drawing Sheets

U.S. PATENT DOCUMENTS

| | | |
|---|---|---|
| 7,087,308 B2 | 8/2006 | Sakurada et al. |
| 2004/0239248 A1* | 12/2004 | Chang et al. ............... 313/582 |
| 2005/0057171 A1 | 3/2005 | Sakurada et al. |
| 2005/0095449 A1 | 3/2005 | Yanagisawa et al. |
| 2005/0077826 A1* | 4/2005 | Watanabe et al. ........... 313/587 |
| 2007/0069245 A1 | 3/2007 | Sakurada et al. |

FOREIGN PATENT DOCUMENTS

| | | |
|---|---|---|
| JP | 8-32436 | 3/1996 |
| JP | 11-119666 A | 4/1999 |
| JP | 11-307987 A | 11/1999 |
| JP | 2000-59082 A | 2/2000 |
| JP | 2000-294980 A | 10/2000 |
| JP | 2002-6106 A | 1/2002 |
| JP | 2003-58064 A | 2/2003 |
| JP | 2003-157018 A | 5/2003 |
| JP | 2003-313651 A | 11/2003 |
| JP | 2003-318594 A | 11/2003 |
| JP | 2004-304373 A | 10/2004 |
| WO | WO 98/13850 | 4/1998 |
| WO | WO 03071507 A1 * | 8/2003 |

OTHER PUBLICATIONS

U.S. Appl. No. 11/970,097, filed Jan. 7, 2008, Morimoto et al.

U.S. Appl. No. 12/726,905, filed Mar. 18, 2010, Morino et al.

\* cited by examiner

ELECTROCONDUCTIVE LAMINATE, AND ELECTROMAGNETIC WAVE SHIELDING FILM AND PROTECTIVE PLATE FOR PLASMA DISPLAY

TECHNICAL FIELD

The present invention relates to an electroconductive laminate, an electromagnetic wave shielding film for a plasma display having electromagnetic wave shielding properties for shielding electromagnetic noises generated from a plasma display panel (hereinafter referred to as a PDP) provided on the observer side of the PDP to protect the PDP main body, and a protective plate for a plasma display.

BACKGROUND ART

Electroconductive laminates having transparency are used as a transparent electrode of e.g. a liquid crystal display device, a windshield for an automobile, a heat mirror, an electromagnetic wave shielding window glass, etc. For example, Patent Document 1 discloses a coated electroconductive laminate comprising a transparent substrate, and a transparent oxide layer comprising zinc oxide and a silver layer alternately laminated on the substrate in a total layer number of (2n+1) (wherein n is an integer of at least 1). Such an electroconductive laminate is described to have sufficient electrical conductivity (electromagnetic wave shielding properties) and visible light transparency. However, if the lamination number n is increased to increase the number of silver layers so as to further improve electrical conductivity (electromagnetic wave shielding properties) of the electroconductive laminate, the visible light transparency tends to decrease.

Further, an electroconductive laminate is used also as an electromagnetic wave shielding film for a plasma display. Since electromagnetic waves are emitted from the front of a PDP, for the purpose of shielding the electromagnetic waves, an electromagnetic wave shielding film comprising a substrate such as a plastic film and an electroconductive film formed on the substrate is disposed on the observer side of a PDP.

For example, Patent Document 2 discloses a protective plate for a plasma display comprising, as an electroconductive film, a laminate having an oxide layer and a metal layer alternately laminated.

An electromagnetic wave shielding film is required to have a high transmittance and a low reflectance over the entire visible light region, i.e. to have a broad transmission/reflection band, and to have high shielding properties in the near infrared region. In order to broaden the transmission/reflection band, the number of lamination of the oxide layer and the metal layer should be increased. However, if the number of lamination is increased, such problems arose such that the internal stress of the electromagnetic wave shielding film increases, whereby the film curls, or the electroconductive film may be broken to increase the resistance. Further, if the number of lamination is increased, the visible light transparency decreases in some cases. Thus, heretofore, the number of lamination of the oxide layer and the metal layer in the electroconductive film has been limited, and an electromagnetic wave shielding film having a broad transmission/reflection band even in a small number of lamination and having excellent electrical conductivity (electromagnetic wave shielding properties) and visible light transparency has not been known.

Patent Document 1: JP-B-8-32436
Patent Document 2: WO98/13850

DISCLOSURE OF THE INVENTION

Object to be Accomplished by the Invention

It is an object of the present invention to provide an electroconductive laminate having a broad transmission/reflection band even in a small number of lamination and having excellent electrical conductivity (electromagnetic wave shielding properties), visible light transparency and near infrared shielding properties, an electromagnetic wave shielding film for a plasma display and a protective plate for a plasma display.

Means to Accomplish the Object

The electroconductive laminate of the present invention is an electroconductive laminate comprising a substrate and an electroconductive film formed on the substrate, wherein the electroconductive film has a multilayer structure having an oxide layer and a metal layer alternately laminated from the substrate side in a total layer number of (2n+1) (wherein n is an integer of at least 1); the oxide layer contains zinc oxide and a high refractive index metal oxide having a refractive index of at least 2.3 as the main components; and the metal layer contains silver or a silver alloy as the main component.

The high refractive index metal oxide is preferably titanium oxide and/or niobium oxide.

The metal layer is provided preferably in a layer number of from 2 to 8.

The metal layer is preferably made of pure silver or a silver alloy containing gold and/or bismuth.

The electromagnetic wave shielding film for a plasma display of the present invention is characterized by being the electroconductive laminate of the present invention.

The protective plate for a plasma display of the present invention is characterized by comprising a support, the electromagnetic wave shielding film for a plasma display of the present invention formed on the support, and an electrode electrically in contact with the electroconductive film of the electromagnetic wave shielding film for a plasma display.

The protective plate for a plasma display of the present invention may further comprise an electroconductive mesh film.

Effects of the Invention

The electroconductive laminate of the present invention has a broad transmission/reflection band even in a small number of lamination and has excellent electrical conductivity (electromagnetic wave shielding properties), visible light transparency and near infrared shielding properties.

The electromagnetic wave shielding film for a plasma display of the present invention has a broad transmission/reflection band even in a small number of lamination and has excellent electrical conductivity (electromagnetic wave shielding properties), visible light transparency and near infrared shielding properties.

The protective plate for a plasma display of the present invention has excellent electromagnetic wave shielding properties, has a broad transmission/reflection band, has a high visible light transmittance and has excellent near infrared shielding properties.

MEANINGS OF SYMBOLS 1,2,3: protective plate, 10: electroconductive laminate, 11: substrate, 12: electroconductive film, 12a: oxide layer, 12b: metal layer, 12c: barrier layer, 12d: protective film, 20: support, 30: color ceramic layer, 40: shatterproof film, 70: adhesive layer, 50: electrode, 80: electroconductive mesh film, 90: electrode

BEST MODE FOR CARRYING OUT THE INVENTION

Electroconductive Laminate

Now, one embodiment (hereinafter referred to as an embodiment) of the electroconductive laminate of the present invention will be described.

Figure 1:
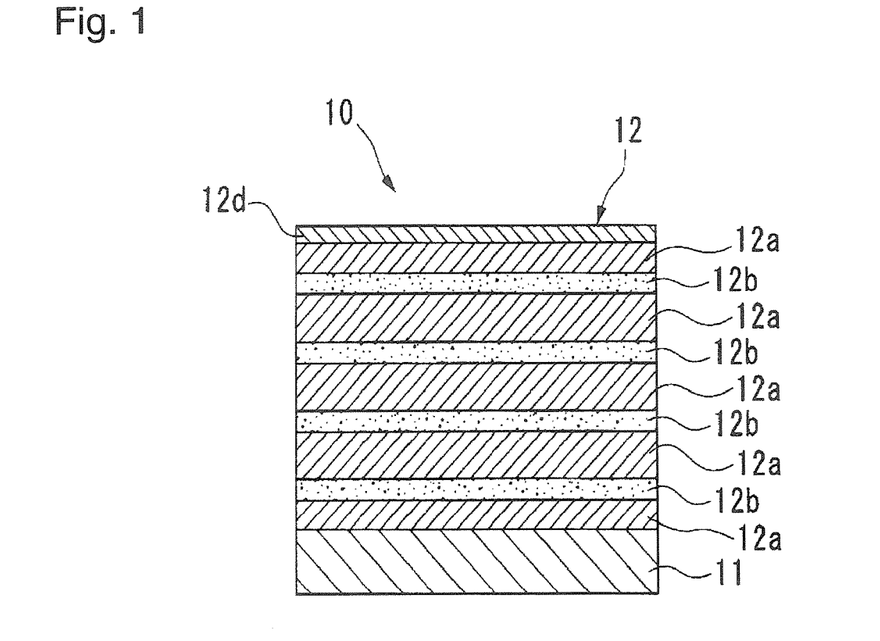
FIG. 1 is a cross-section illustrating one embodiment of the electroconductive laminate of the present invention.

FIG. 1 illustrates an electroconductive laminate 10 according to the present embodiment. This electroconductive laminate 10 comprises a substrate 11 and an electroconductive film 12.

(Substrate)

As a Material of the Substrate 11, a Glass Plate (including tempered glass such as air-cooled tempered glass or chemically tempered glass) or a transparent plastic material such as polyethylene terephthalate (PET), triacetyl cellulose (TAC), tricarbonate (PC) or polymethylmethacrylate (PMMA) may, for example, be mentioned.

(Electroconductive Film)

The electroconductive film 12 has a multilayer structure having an oxide layer 12a and a metal layer 12b alternately laminated from the substrate 11 side in a total layer number of (2n+1) (wherein n is an integer of at least 1).

In the electroconductive film 12, preferably from 2 to 8 metal layers, are provided, more preferably from 2 to 6. When at least 2 metal layers are provided, the resistance can be sufficiently low, and when at most 8 metal layers are provided, the increase in the internal stress of the electroconductive laminate 10 can be more suppressed.

The electroconductive film 12 has a resistance of preferably from 0.4 to 3.5Ω so as to secure sufficient electromagnetic wave shielding properties, more preferably from 0.5 to 2.5Ω, particularly preferably from 0.5 to 1.5Ω.

(Oxide Layer)

The oxide layer 12a in the electroconductive film 12 is a layer containing a high refractive index metal oxide having a refractive index of at least 2.3 and zinc oxide as the main components. The oxide layer 12a preferably contains a high refractive index metal oxide having a refractive index of at least 2.3 and zinc oxide in a total amount of at least 90 mass %, more preferably at least 95 mass %, particularly preferably at least 99 mass %.

Among high refractive index metal oxides having a refractive index of at least 2.3, preferred is titanium oxide (refractive index 2.5) and/or niobium oxide (refractive index 2.4) with a view to further broadening the reflection band. In the present invention, the "refractive index" is the refractive index at a wavelength of 550 nm.

By the presence of the high refractive index metal oxide, the refractive index of the oxide layer 12a can be increased, and the transmission/reflection band of the electroconductive film 12 can be broadened. In the oxide layer 12a, the ratio of the metal in the high refractive index metal oxide to the total amount of the metal and zinc is preferably from 1 to 50 at %, particularly preferably from 5 to 20 at %. Within this range, the transmission/reflection band can be maintained broad and further, an electroconductive film having favorable moisture resistance can be obtained. The reason is not necessarily clear but is considered to be because the stress of the oxide layer 12a and the metal layer 12b can be released while favorable physical properties of zinc oxide are maintained within this range.

The oxide layer 12a may contain a metal oxide other than zinc oxide, titanium oxide and niobium oxide within a range not to impair physical properties. For example, for the purpose of imparting electrical conductivity, gallium oxide, indium oxide, aluminum oxide, magnesium oxide, tin oxide or the like may be incorporated.

The geometrical film thickness (hereinafter referred to simply as the thickness) of the oxide layer 12a is preferably from 20 to 60 nm (particularly from 30 to 50 nm) in the case of an oxide layer closest to the substrate and an oxide layer farthest from the substrate and is preferably from 40 to 120 nm (particularly from 40 to 100 nm) in the case of other oxide layers.

(Metal Layer)

The metal layer 12b is a layer containing silver or a silver alloy as the main component. By the metal layer 12b formed by silver or a silver alloy, the resistance of the electroconductive film 12 can be made low.

The metal layer 12b is preferably a layer made of pure silver with a view to lowering the resistance of the electroconductive film 12. In the present invention, the "pure silver" means that the metal layer 12b (100 mass %) contains silver in an amount of 99.9 mass % or more.

The metal layer 12b is preferably a layer made of a silver alloy containing gold and/or bismuth with a view is to suppressing migration of silver and thus increasing moisture resistance. The total amount of gold and bismuth is preferably from 0.2 to 1.5 mass % in the metal layer 12b (100 mass %) so that the resistivity will be at most 4.5 μΩcm.

The total thickness of the metal layer 12b is, for example, in a case where the aimed resistance of the electroconductive laminate 10 to be obtained is 1.5Ω, preferably from 25 to 60 nm (particularly from 25 to 50 nm), and in a case where the aimed resistance is 0.9Ω, preferably from 35 to 80 nm (particularly from 35 to 70 nm). With respect to the thickness of each metal layer, the total thickness is properly allocated among the respective metal layers. Since the specific resistivities of the respective metal layers increase as the number of the metal layers increases, the total thickness tends to increase so as to lower the resistance.

(Method of Forming Electroconductive Film)

The method of forming the electroconductive film 12 (oxide layer 12a, metal layer 12b) on the substrate 11 is not particularly limited, and for example, sputtering, vacuum deposition, ion plating, chemical vapor deposition, etc. may be utilized. Among them, sputtering is suitable in view of the stability of quality and properties. The sputtering may, for example, be pulse sputtering or AC sputtering.

Formation of the electroconductive film 12 by sputtering may be carried out, for example, as follows. First, on the surface of the substrate 11, an oxide layer 12a is formed by pulse sputtering using a target consisting of zinc oxide and a high refractive index metal oxide (hereinafter referred to as a ZnO mixed target) by introducing an argon gas with which oxygen gas is mixed.

Then, a metal layer 12b is formed by pulse sputtering using a silver target or a silver alloy target by introducing an argon gas. These operations are repeatedly carried out, and finally an oxide layer 12a is formed by the same method as above to form an electroconductive film 12 having a multilayer structure.

The ZnO mixed target can be prepared by mixing high purity (usually 99.9%) powders of the respective components, followed by firing by hot pressing or HIP (hot isostatic pressing). In the case of hot pressing, specifically, zinc oxide powder containing a high refractive index metal oxide is hot-pressed in vacuum or in an inert gas atmosphere at maximum temperature of from 1,000 to 1,200° C. to prepare the target. The ZnO mixed target is preferably one having porosity of at most 5.0% and having a resistivity less than 1 Ωcm.

(Protective Film)

In the electroconductive film 12 according to the present embodiment, a protective film 12d is provided on the uppermost oxide layer 12a. The protective film 12d protects the oxide layer 12a and the metal layer 12b from moisture and protects the oxide layer 12a from an adhesive (particularly an alkaline adhesive) when an optional resin film (e.g. a functional film such as moistureproof film, shatterproof film, antireflection film, protective film for e.g. near infrared shielding or near infrared-absorbing film) is bonded to the outermost oxide layer 12a. The protective film 12b is an optional constituent in the present invention and may be omitted.

Specifically, the protective film 12d may, for example, be a film of an oxide or nitride of a metal such as Sn, In, Ti or Si, particularly preferably an indium-tin oxide (ITO) film.

The thickness of the protective film 12d is preferably from 2 to 30 nm, more preferably from 3 to 20 nm.

(Barrier Layer)

Figure 2:
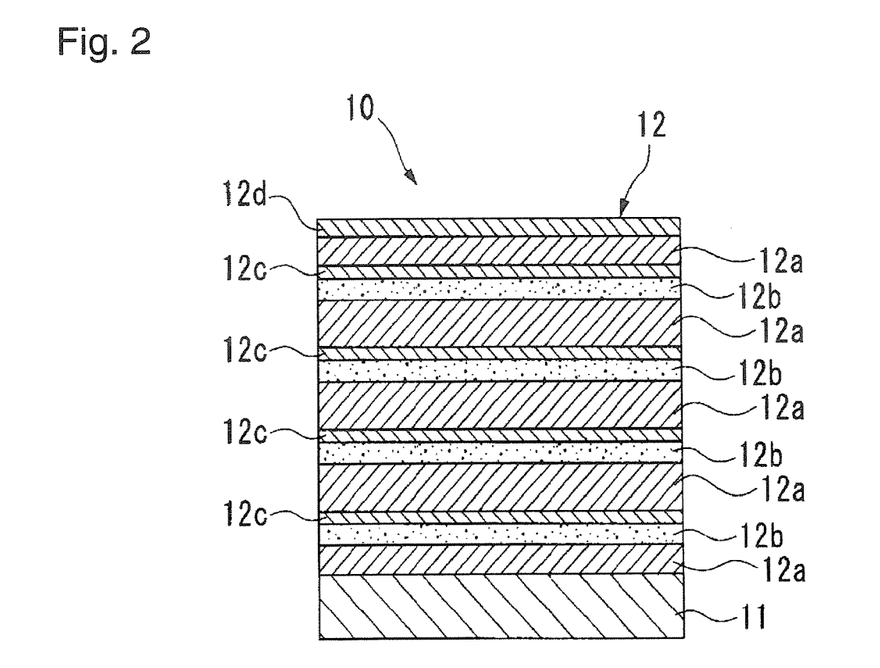
FIG. 2 is a cross-section illustrating another embodiment of the electroconductive laminate of the present invention.

As shown in FIG. 2, in the electroconductive film 12, an oxide layer 12a and a metal layer 12b are alternately laminated, and a barrier layer 12c may be provided between the oxide layer 12a and the metal layer 12b. When the barrier layer 12c is provided on the metal layer 12b, as described above, oxidation of the metal layer 12b can be prevented when the oxide layer 12a is formed in an oxygen atmosphere. The barrier layer 12c may be one which can be formed in the absence of oxygen, and its material may, for example, be aluminum-doped zinc oxide or tin-doped indium oxide.

The electroconductive laminate of the present invention preferably has a luminous transmittance of at least 55%, more preferably at least 60%. Further, the electroconductive laminate of the present invention preferably has a transmittance at a wavelength of 850 nm of preferably at most 5%, particularly preferably at most 2%.

(Application)

The electroconductive laminate of the present invention is excellent in electrical conductivity (electromagnetic wave shielding properties), visible light transparency and near infrared shielding properties, and when laminated on a support of e.g. glass, has a broad transmission/reflection band and is thereby useful as an electromagnetic wave shielding film for a plasma display.

Further, the electroconductive laminate of the present invention can be used as a transparent electrode of e.g. a liquid crystal display device. Such a transparent electrode has a low surface resistance and is thereby well responsive, and has a reflectance as low as that of glass and thereby provides good visibility.

Further, the electroconductive laminate of the present invention can be used as a windshield for an automobile. Such a windshield for an automobile exhibits function to prevent fogging or to melt ice by applying a current to the electroconductive film, the voltage required to apply the current is low since it has a low resistance, and it has a reflectance so low as that of glass, whereby visibility of a driver will not be impaired.

The electroconductive laminate of the present invention, which has a very high reflectance in the infrared region, can be used as a heat mirror to be provided on e.g. a window of a building.

Further, the electroconductive laminate of the present invention, which has a high electromagnetic wave shielding effect, can be used for an electromagnetic wave shielding window glass which prevents electromagnetic waves emitted from electrical and electronic equipment from leaking out of the room and prevents electromagnetic waves affecting electrical and electronic equipment from invading the interior from the outside.

Protective Plate for Plasma Display

Now, an example wherein the electroconductive laminate of the present invention is used as an electromagnetic wave shielding film of a protective plate for a plasma display (hereinafter referred to as a protective plate) will be described.

First Embodiment

Figure 3:
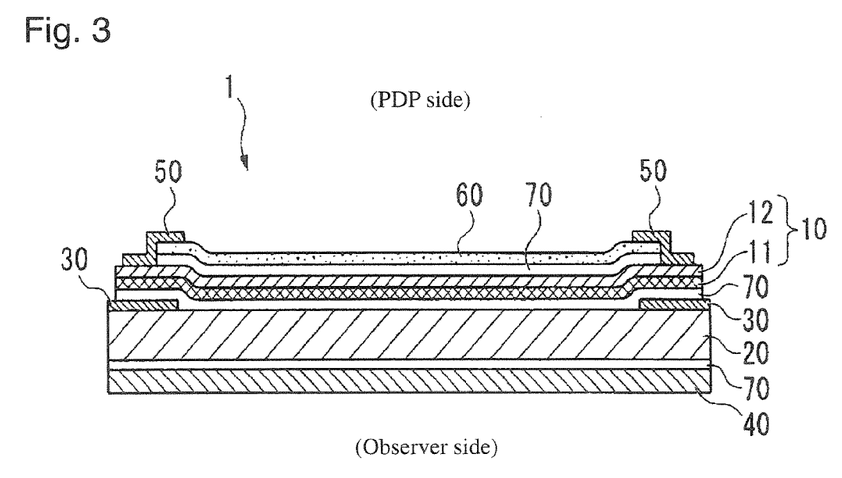
FIG. 3 is a cross-section illustrating a first embodiment of the protective plate of the present invention.

FIG. 3 illustrates a protective plate according to a first embodiment. The protective plate 1 comprises a support 20, the above electroconductive laminate 10 provided on the support 20, a color ceramic layer 30 provided at a peripheral portion on the electroconductive laminate 10 side of the support 20, a shatterproof film 40 bonded on the opposite side of the support 20 from the electroconductive layer 10, an electrode 50 electrically in contact at a peripheral portion of the electroconductive film 12 of the electroconductive layer 10, and a protective film 60 provided on the electroconductive laminate 10.

An adhesive layer 70 is provided between the electroconductive laminate 10 and the support 20, between the electroconductive laminate 10 and the protective film 60, and between the support 20 and the shatterproof layer 40.

Further, this protective plate 1 is one having the electroconductive laminate 10 formed on the PDP side of the support 20.

(Support)

The support 20 in the protective plate 1 is a transparent substrate having higher rigidity than that of the substrate 11 of the electroconductive laminate 10. By providing the support 20, no warpage will occur by the temperature difference caused between the surface on the PDP side and the opposite side, even if the material of the substrate 11 of the electroconductive laminate 10 is a plastic such as a PET.

As a material of the support 20, the same material as the above-described material of the substrate 11 of the electroconductive laminate 10 may, for example, be mentioned.

(Color Ceramic Layer)

The color ceramic layer 30 is a layer to mask the electrode 50 so that it will not directly be seen from the observer side.

The color ceramic layer 30 can be formed, for example, by printing on the support 20 or by bonding a color tape.
(Shatterproof Film)

The shatterproof film 40 is a film to prevent flying of fragments of the support 20 when the support 20 is damaged. The shatterproof film 40 is not particularly limited, and one which is commonly used for a protective plate can be used.

The shatterproof film 40 may have an antireflection function. Various films having both shatterproof function and antireflection function are known, and any such film can be used. For example, ARCTOP (tradename) manufactured by Asahi Glass Company, Limited may be mentioned. ARCTOP (tradename) is a polyurethane type flexible resin film having self-healing properties and shatterproof properties, having a low refractive index antireflection film made of an amorphous fluoropolymer formed on one side of the film to apply antireflection treatment. Further, a film comprising a plastic film such as PET and a low refractive index antireflection layer formed thereon wetly or dryly may also be mentioned.
(Electrode)

The electrode 50 is provided to be electrically in contact with the electroconductive film 12 so that the electromagnetic wave shielding effect of the electroconductive film 12 of the electroconductive laminate 10 is exhibited.

The electrode 50 is preferably provided on the entire peripheral portion of the electroconductive film 12 with a view to securing the electromagnetic wave shielding effect of the electroconductive film 12.

As a material of the electrode 50, one having a lower resistance is superior in view of the electromagnetic wave shielding properties. For example, one prepared by applying a silver (Ag) paste (a paste containing Ag and glass frit) or a copper (Cu) paste (a paste containing Cu and glass frit), followed by firing is suitably used.
(Protective Film)

The protective film 60 is a film to protect the electroconductive film 12 of the electroconductive laminate 10. Specifically, to protect the electroconductive film 12 from moisture, a moisture-proof film is provided. The moisture-proof film is not particularly limited, and one which is commonly used for a protective plate may be used, such as a plastic film of e.g. PET or polyvinylidene chloride.

Further, as the protective film 60, the above-described shatterproof film may be used.
(Adhesive Layer)

As an adhesive of the adhesive layer 70, a commercially available adhesive can be used. Preferred specific examples include adhesives such as an acrylic ester copolymer, a polyvinyl chloride, an epoxy resin, a polyurethane, a vinyl acetate copolymer, a styrene/acrylic copolymer, a polyester, a polyamide, a polyolefin, a styrene/butadiene copolymer type rubber, a butyl rubber and a silicone resin. Particularly, an acrylic adhesive is preferred, with which favorable moistureproof properties are achieved.

Further, in this adhesive layer 70, various functional additives such as an ultraviolet absorber may be incorporated.

Second Embodiment

Figure 4:
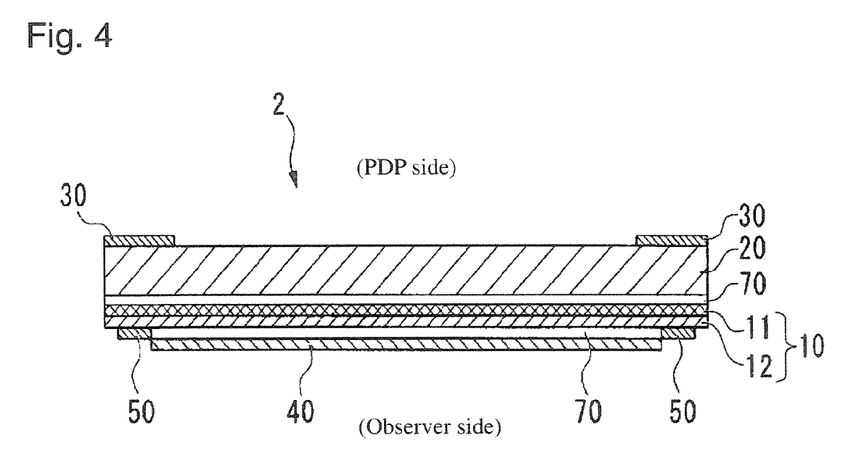
FIG. 4 is a cross-section illustrating a second embodiment of the protective plate of the present invention.

FIG. 4 illustrates a protective plate according to a second embodiment. This protective plate 2 comprises a support 20, an electroconductive laminate 10 formed on one side of the support 20, a shatterproof film 40 formed on the electroconductive laminate 10, an electrode 50 electrically in contact with the electroconductive film 12 of the electroconductive laminate 10 at the peripheral portion, and a color ceramic layer 30 provided at a peripheral portion on the opposite side of the support 20 from the electroconductive laminate 10. Further, the shatterproof film 40 is provided inside the electrode 50.

In this embodiment, the same constituents as in the first embodiment are expressed by the same symbols as in FIG. 3 and their description is omitted.

The protective plate 2 according to the second embodiment is one having the electroconductive laminate 10 provided on the observer side of the support 20.

Third Embodiment

Figure 5:
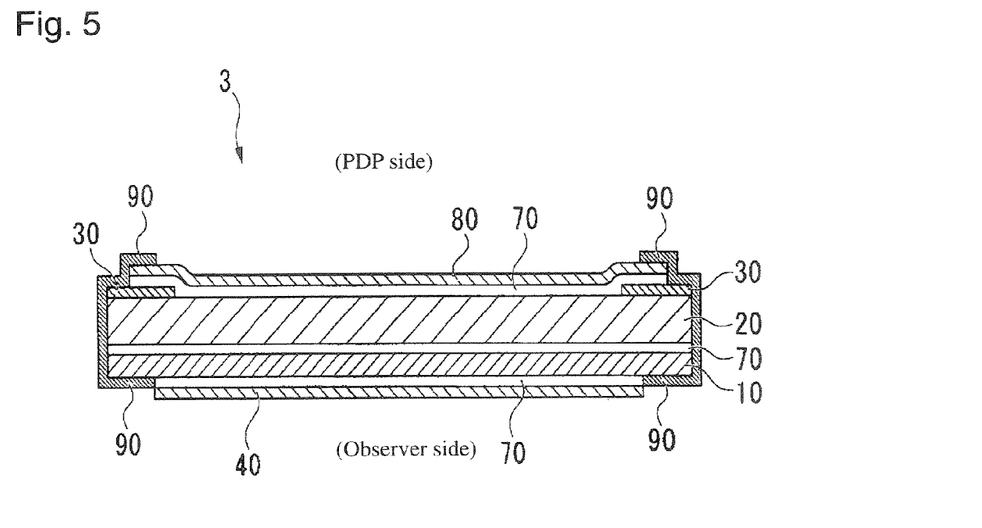
FIG. 5 is a cross-section illustrating a third embodiment of the protective plate of the present invention.

FIG. 5 illustrates a protective plate according to a third embodiment. A protective plate 3 comprises a support 20, an electroconductive laminate 10 bonded on the surface of the support 20 via an adhesive layer 70, a shatterproof film 40 bonded on the surface of the electroconductive laminate 10 via an adhesive layer 70, a color ceramic layer 30 provided at a peripheral portion on the surface of the support 20 on the opposite side from the electroconductive laminate 10, an electroconductive mesh film 80 bonded on the surface of the support 20 via an adhesive layer 70 so that a peripheral portion of the electroconductive mesh film 80 is overlaid on the color ceramic layer 30, and an electrode 90 provided at a peripheral portion of the protective plate 3 so as to electrically connect an electroconductive film 12 of the electroconductive laminate 10 to an electroconductive mesh layer (not shown) of the electroconductive mesh film 80. The protective plate 3 is an example wherein the electroconductive laminate 10 is provided on the observed side of the support 20 and the electroconductive mesh film 80 is provided on the PDP side of the support 20.

In the third embodiment, the same constituents as in the first embodiment are expressed by the same symbols as in FIG. 3 and their description is omitted.

The electroconductive mesh film 80 is one comprising a transparent film and an electroconductive mesh film made of copper formed on the transparent film. Usually, it is produced by bonding a copper foil to a transparent film, and processing the laminate into a mesh.

The copper foil may be either rolled copper or electrolytic copper, and known one is used property according to need. The copper foil may be subjected to surface treatment. The surface treatment may, for example, be chromate treatment, surface roughening, acid wash or zinc chromate treatment. The thickness of the copper foil is preferably from 3 to 30 μm, more preferably from 5 to 20 μm, particularly preferably from 7 to 10 μm. When the thickness of the copper foil is at most 30 μm, the etching time can be shortened, and when it is at least 3 μm, high electromagnetic wave shielding properties will be achieved.

The open area of the electroconductive mesh layer is preferably from 60 to 95%, more preferably from 65 to 90%, particularly preferably from 70 to 85%.

The shape of the openings of the electroconductive mesh layer is an equilateral triangle, a square, an equilateral hexagon, a circle, a rectangle, a rhomboid or the like. The open areas are preferably uniform in shape and aligned in a plane.

With respect to the size of the openings, one side or the diameter is preferably from 5 to 200 μm, more preferably from 10 to 150 μm. When one side or the diameter of the openings is at most 200 μm, electromagnetic wave shielding properties will improve, and when it is at least 5 μm, influences over an image of a PDP will be small.

The width of a metal portion other than the openings is preferably from 5 to 50 μm. That is, the mesh pitch of the openings is preferably from 10 to 250 μm. When the width of the metal portion is at least 5 µm, processing will be easy, and when it is at most 50 µm, influences over an image of a PDP will be small.

If the sheet resistance of the electroconductive mesh layer is lower than necessary, the film tends to be thick, and such will adversely affect optical performance, etc. of the protective plate 3, such that no sufficient openings can be secured. On the other hand, if the sheet resistance of the electroconductive mesh layer is higher than necessary, no sufficient electromagnetic wave shielding properties will be obtained. Accordingly, the sheet resistance of the electroconductive mesh layer is preferably from 0.01 to 10Ω/□, more preferably from 0.01 to 2Ω/□, particularly preferably from 0.05 to 1Ω/□.

The sheet resistance of the electroconductive mesh layer can be measured by a four-probe method using electrodes at least five times larger than one side or the diameter of the opening with a distance between electrodes at least five times the mesh pitch of the openings. For example, when 100 µm square openings are regularly arranged with metal portions with a width of 20 µm, the sheet resistance can be measured by arranging electrodes with a diameter of 1 mm with a distance of 1 mm. Otherwise, the electroconductive mesh film is processed into a stripe, electrodes are provided on both ends in the longitudinal direction to measure the resistance R therebetween thereby to determine the sheet resistance from the length a in the longitudinal direction and the length b in the lateral direction in accordance with the following formula:

Sheet resistance=R×b/a

To laminate a copper foil on a transparent film, a transparent adhesive is used. The adhesive may, for example, be an acrylic adhesive, an epoxy adhesive, a urethane adhesive, a silicone adhesive or a polyester adhesive. As a type of the adhesive, a two-liquid type or a thermosetting type is preferred. Further, the adhesive is preferably one having excellent chemical resistance.

As a method of processing a copper foil into a mesh, a photoresist process may be mentioned. In the print process, the pattern of the openings is formed by screen printing. By the photoresist process, a photoresist material is formed on a copper foil by roll coating, spin coating, overall printing or transferring, followed by exposure, development and etching to form the pattern of the openings. As another method of forming the electroconductive mesh layer, a method of forming the pattern of the openings by the print process such as screen printing may be mentioned.

The electrode 90 is to electrically connect the electroconductive film 12 of the electroconductive laminate 10 to the electroconductive mesh layer of the electroconductive mesh film 80. The electrode 90 may, for example, be an electroconductive tape. By connecting the electroconductive film 12 of the electroconductive laminate 10 to the electroconductive mesh layer of the electroconductive mesh film 80, the whole sheet resistance can be further decreased, whereby the electromagnetic wave shielding effect will further improve.

As each of the protective plates 1 to 3 is disposed in front of a PDP, it preferably has a visible light transmittance of at least 40% so as not to prevent an image of the PDP from being seen. Further, the visible light reflectance is preferably less than 6%, particularly preferably less than 3%. Further, the transmittance at a wavelength of 850 nm is preferably at most 5% particularly preferably at most 2%.

Each of the protective plates 1 to 3 according to the above-described first to third embodiments comprises a support 20, an electroconductive laminate 10 provided on the support 20, and an electrode 50 or an electrode 90 electrically in contact with an electroconductive film 12 of the electroconductive laminate 10. Further, as described above, the electroconductive film 12 of the electroconductive laminate 10 has a multilayer structure having an oxide layer 12a and a metal layer 12b alternately laminated from the substrate 11 side in a total layer number of (2n+1) (wherein n is an integer of at least 1), the oxide layer 12a contains a high refractive index metal oxide having a refractive index of at least 2.3 and zinc oxide as the main components, and the metal layer 12b contains silver or a silver alloy as the main component. With such an electroconductive laminate 10, since the oxide layer 12a of the electroconductive film 12 contains a high refractive index metal oxide, the transmission/reflection band can be broadened. Thus, a protective plate with a broad transmission/reflection band can be obtained even without an increase in the lamination number. Further, by not increasing the lamination number, the visible light transparency can be increased. Further, since zinc oxide contained in the oxide layer 12a has crystallinity, the metal in the metal layer 12b formed on the oxide layer 12a is also likely to be crystallized and is less likely to undergo migration. As a result, the protective plate has high electrical conductivity and has high electromagnetic wave shielding properties.

Further, the protective plate of the present invention is not limited to the above-described embodiments. For example, in the above-described embodiment, films are laminated via an adhesive layer 70, but bonding by heat is possible without using an adhesive or a bonding agent in some cases.

Further, the protective plate of the present invention may have an antireflection film or an antireflection layer which is a low refractive index thin film as the case requires. The antireflection film is not particularly limited and one which is usually used for a protective plate may be used. Particularly when a fluororesin type film is used, more excellent antireflection properties will be achieved.

With respect to the antireflection layer, in order that the reflectance of the protective plate to be obtained is low and the preferred reflected color will be obtained, the wavelength at which the reflectance of the antireflection layer by itself in the visible range is minimum, is preferably from 500 to 600 nm, particularly preferably from 530 to 590 nm.

Further, the protective plate may be made to have near infrared shielding function. As a method to make the protective plate have near infrared shielding function, a method of using a near infrared shielding film, a method of using a near infrared absorbing substrate, a method of using an adhesive having a near infrared absorber incorporated therein at the time of laminating films, a method of adding a near infrared absorber to an antireflection resin film or the like to make the film or the like have near infrared absorbing function, a method of using an electroconductive film having near infrared reflection function may, for example, be mentioned.

EXAMPLES

Example 1

A high purity zinc oxide powder and a high purity titanium oxide powder were mixed in a ball mill so that the mass ratio of zinc oxide:titanium oxide=80:20 to prepare a powder mixture. The powder mixture was put in a carbon mold for hot pressing, and hot pressing was carried out under conditions where the mold was held in an argon gas atmosphere at 1,100° C. for one hour to obtain a mixed target of zinc oxide and titanium oxide. The pressure of the hot press was 100 kg/cm$^2$.

An electroconductive laminate shown in FIG. 2 was prepared as follows.

First, dry cleaning by ion beams was carried out as follows for the purpose of cleaning the surface of a PET film with a thickness of 100 μm as a substrate 11. First, about 30% of oxygen was mixed with an argon gas, and an electric power of 100 W was charged. Argon ions and oxygen ions ionized by an ion beam source were applied to the surface of the substrate.

Then, on the surface of the substrate to which the dry cleaning treatment was applied, pulse sputtering was carried out using the mixed target of zinc oxide and titanium oxide (zinc oxide:titanium oxide=80:20 (mass ratio)) by introducing a gas mixture of an argon gas and 10 vol % of an oxygen gas under a pressure of 0.73 Pa at a frequency of 50 kHz at an electric power density of 4.5 W/cm$^2$ at a reverse pulse duration of 2 μs to form an oxide layer 12a with a thickness of 35 nm. As measured by Rutherford backscattering spectrometry, in the oxide layer 12a, zinc occupied 80 at % and titanium occupied 20 at % based on the total amount (100 at %) of zinc and titanium. Further, in the oxide layer 12a, zinc occupied 34.3 at %, titanium occupied 8.0 at % and oxygen occupied 57.7 at % based on all atoms (100 at %). As calculated as ZnO and TiO$_2$, the total amount of oxides was 96.7 mass %.

Then, pulse sputtering was carried out using a silver alloy target doped with 1.0 mass % of gold by introducing an argon gas under a pressure of 0.73 Pa at a frequency of 50 kHz at an electric power density of 2.3 W/cm$^2$ with a reverse pulse duration of 10 μs to form a metal layer 12b with a thickness of 10 nm.

Then, pulse sputtering was carried out using a zinc oxide target doped with 5 mass % of alumina by introducing an argon gas under a pressure of 0.45 Pa at a frequency of 50 kHz at an electric power density of 2.7 W/cm$^2$ with a reverse pulse duration of 2 μs to form a zinc oxide film (barrier layer 12c) with a thickness of 5 nm.

Then, pulse sputtering was carried out by using the mixed target of zinc oxide and titanium oxide (zinc oxide:titanium oxide=80:20 (mass ratio)) by introducing a gas mixture of an argon gas and 10 vol % of an oxygen gas under a pressure of 0.73 Pa at a frequency of 50 kHz at an electric power density of 4.5 W/cm$^2$ with a reverse pulse duration of 2 μs to form a zinc oxide/titanium oxide mixed film with a thickness of 65 nm. An oxide layer 12a was formed by the zinc oxide film and the zinc oxide/titanium oxide mixed film thus obtained.

Then, pulse sputtering was carried out using a silver alloy target doped with 1.0 mass % of gold by introducing an argon gas under a pressure of 0.73 Pa at a frequency of 50 kHz at an electric power density of 2.3 W/cm$^2$ with a reverse pulse duration of 10 μs to form a metal layer 12b with a thickness of 14 nm.

Then, pulse sputtering was carried out using a zinc oxide target doped with 5 mass % of alumina by introducing an argon gas under a pressure of 0.45 Pa at a frequency of 50 kHz at an electric power density of 2.7 W/cm$^2$ with a reverse pulse duration of 2 μs to form a zinc oxide film (barrier layer 12c) with a thickness of 5 nm.

Then, pulse sputtering was carried out by using the mixed target of zinc oxide and titanium oxide (zinc oxide:titanium oxide=80:20 (mass ratio)) by introducing a gas mixture of an argon gas and 10 vol % of an oxygen gas under a pressure of 0.73 Pa at a frequency of 50 kHz at an electric power density of 4.5 W/cm$^2$ with a reverse pulse duration of 2 μs to form a zinc oxide/titanium oxide mixed film with a thickness of 65 nm. An oxide layer 12a was formed by the zinc oxide film and the zinc oxide/titanium oxide mixed film thus obtained.

Then, pulse sputtering was carried out using a silver alloy target doped with 1.0 mass % of gold by introducing an argon gas under a pressure of 0.73 Pa at a frequency of 50 kHz at an electric power density of 2.3 W/cm$^2$ with a reverse pulse duration of 10 μs to form a metal layer 12b with a thickness of 14 nm.

Then, pulse sputtering was carried out using a zinc oxide target doped with 5 mass % of alumina by introducing an argon gas under a pressure of 0.45 Pa at a frequency of 50 kHz at an electric power density of 2.7 W/cm$^2$ with a reverse pulse duration of 2 μs to form a zinc oxide film (barrier layer 12c) with a thickness of 5 nm.

Then, pulse sputtering was carried out by using the mixed target of zinc oxide and titanium oxide (zinc oxide:titanium oxide=80:20 (mass ratio)) by introducing a gas mixture of an argon gas and 10 vol % of an oxygen gas under a pressure of 0.73 Pa at a frequency of 50 kHz at an electric power density of 4.5 W/cm$^2$ with a reverse pulse duration of 2 μs to form a zinc oxide/titanium oxide mixed film with a thickness of 65 nm. An oxide layer 12a was formed by the zinc oxide film and the zinc oxide/titanium oxide mixed film thus obtained.

Then, pulse sputtering was carried out using a silver alloy target doped with 1.0 mass % of gold by introducing an argon gas under a pressure of 0.73 Pa at a frequency of 50 kHz at an electric power density of 2.3 W/cm$^2$ with a reverse pulse duration of 10 μs to form a metal layer 12b with a thickness of 10 nm.

Then, pulse sputtering was carried out using a zinc oxide target doped with 5 mass % of alumina by introducing an argon gas under a pressure of 0.45 Pa at a frequency of 50 kHz at an electric power density of 2.7 W/cm$^2$ with a reverse pulse duration of 2 μs to form a zinc oxide film (barrier layer 12c) with a thickness of 5 nm.

Then, pulse sputtering was carried out by using the mixed target of zinc oxide and titanium oxide (zinc oxide:titanium oxide=80:20 (mass ratio)) by introducing a gas mixture of an argon gas and 10 vol % of an oxygen gas under a pressure of 0.73 Pa at a frequency of 50 kHz at an electric power density of 4.5 W/cm$^2$ with a reverse pulse duration of 2 μs to form a zinc oxide/titanium oxide mixed film with a thickness of 30 nm. An oxide layer 12a was formed by the zinc oxide film and the zinc oxide/titanium oxide mixed film thus obtained.

Then, on the uppermost oxide layer 12a, pulse sputtering was carried out using an ITO target (indium:tin=90:10 (mass ratio)) by introducing a gas mixture of argon and 5 vol % of an oxygen gas, under a pressure of 0.35 Pa at a frequency of 100 kHz at an electric power density of 1.3 W/cm$^2$ with a reverse pulse duration of 1 μs to form an ITO film with a thickness of 5 nm as a protective film 12d.

In such a manner, an electroconductive laminate 10 comprising the oxide layers 12a containing titanium oxide and zinc oxide as the main components and the metal layers 12b made of a gold/silver alloy alternately laminated on the substrate 11, in a number of the oxide layers 12a of 5 and a number of the metal layers 12b of 4, was obtained.

Of the electroconductive laminate in Example 1, the luminous transmittance (stimulus Y stipulated in JIS Z8701) measured by color analyzer TC1800 manufactured by Tokyo Denshoku co., Ltd. was 71.40%, and the luminous reflectance was 6.50%. Further, the transmittance at a wavelength of 850 nm was 0.96%.

Further, the sheet resistance (surface resistance) measured by eddy current type resistance measuring apparatus SRM12 manufactured by Nagy was 0.942Ω. The results are shown in Table 1.

Then, an adhesive layer was provided on the surface on the substrate 11 side of the electroconductive laminate 10.

Using the electroconductive laminate 10, a protective plate 1 shown in FIG. 3 was prepared as follows.

A glass plate as a support 20 was cut into a predetermined size, chamfered and cleaned, and an ink for a color ceramic layer was applied at the periphery of the glass plate by screen printing and sufficiently dried to form a color ceramic layer 30. Then, as the glass tempering treatment, this glass plate was heated to 660° C. and then air cooled to apply glass tempering treatment.

The above electroconductive laminate 10 was bonded on the color ceramic layer 30 side of the glass plate via an adhesive layer 70. Then, for the purpose of protecting the electroconductive laminate 10, a protective film 60 (ARC-TOP CP21, tradename, manufactured by Asahi Glass Company, Limited) was bonded on the electroconductive laminate 10 via an adhesive layer 70. Here, for the purpose of forming electrodes, a portion (electrode formation portion) on which no protective film was bonded was left at the peripheral portion.

Then, on the electrode formation portion, a silver paste (AF4810 manufactured by TAIYO INK MFG. CO., LTD.) was applied by screen printing with a nylon mesh #180 with an emulsion thickness of 20 μm, followed by drying in a circulating hot air oven at 85° C. for 35 minutes to form an electrode 50.

Then, on the back side of the glass plate (a side opposite to the side where the electroconductive laminate 10 was bonded), a polyurethane flexible resin film (ARCTOP URP2199, tradename, manufactured by Asahi Glass Company, Limited) as a shatterproof film 40 was bonded via an adhesive layer 70. This polyurethane flexible resin film also has an antireflection function. Usually, a coloring agent is added to this polyurethane flexible resin film for color tone correction and Ne cut to improve color reproducibility, but in this Example, the resin film was not colored since no evaluation of the color tone correction and the Ne cut was carried out.

Figure 6:
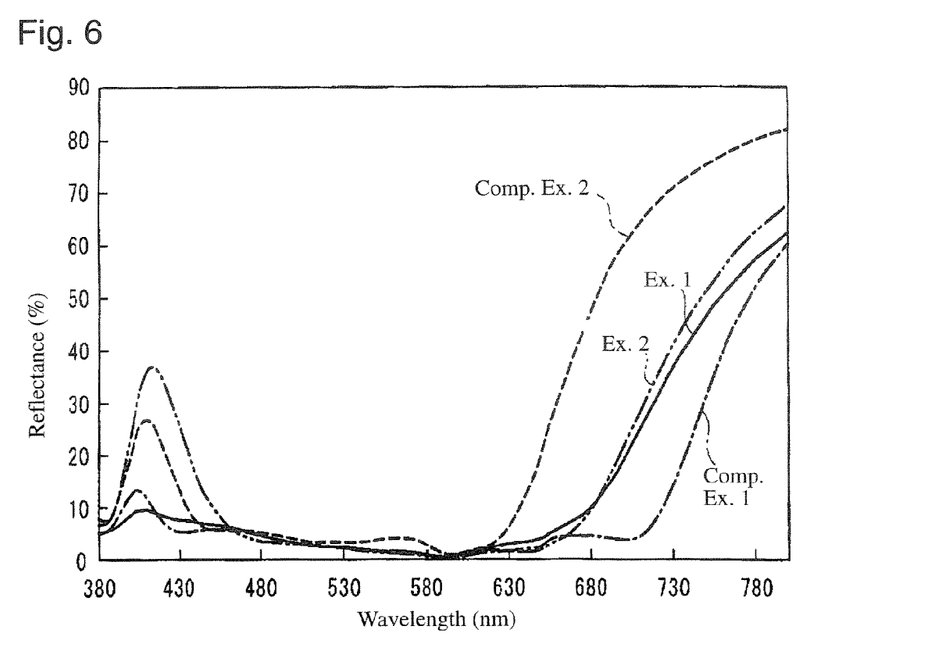
FIG. 6 is a graph illustrating reflection spectra of protective plates in Examples 1 and 2 and Comparative Examples 1 and 2.
Figure 7:
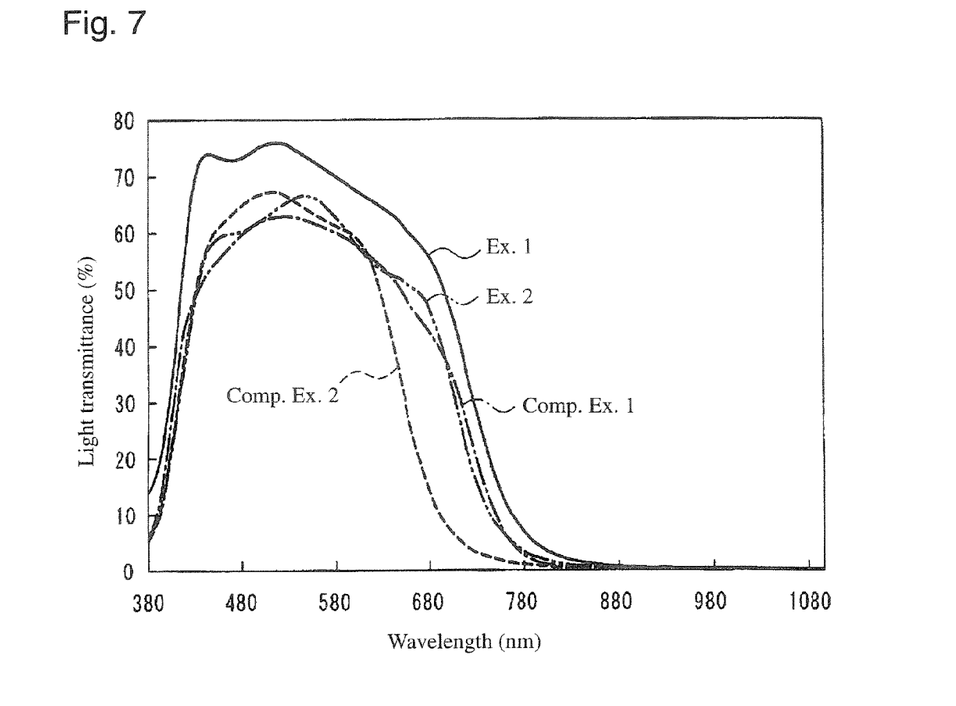
FIG. 7 is a graph illustrating transmission spectra of protective plates in Examples 1 and 2 and Comparative Examples 1 and 2.

Of the protective plate in Example 1, the luminous transmittance (stimulus Y stipulated in JIS Z8701) measured by color analyzer TC1800 manufactured by Tokyo Denshoku co., Ltd. was 71.5%, and the luminous reflectance was 1.92%. Further, the transmittance at a wavelength of 850 nm was 0.76%. The results are shown in Table 2. The reflection spectrum and the transmission spectrum of this protective plate are shown in FIGS. 6 and 7, respectively.

Example 2

An electroconductive laminate and a protective plate were prepared in the same manner as in Example 1 except that a mixed target of zinc oxide and titanium oxide in a mass ratio of zinc oxide:titanium oxide=50:50 was used. In the oxide layer 12a in Example 2, zinc occupied 50 at % and titanium occupied 50 at % based on the total amount (100 at %) of zinc and titanium. Further, in the oxide layer 12a, zinc occupied 23.6 at %, titanium occupied 16.7 at % and oxygen occupied 59.7 at % based on all atoms (100 at %). As calculated as ZnO and $TiO_2$, the total amount of oxides was 97.7 mass %.

Of the electroconductive laminate in Example 2, the luminous transmittance (stimulus Y stipulated in JIS Z8701) measured by color analyzer TC1800 manufactured by Tokyo Denshoku co., Ltd. was 62.94%, and the luminous reflectance was 4.96%. Further, the transmittance at a wavelength of 850 nm was 0.69%.

Further, the sheet resistance (surface resistance) was measured by eddy current type resistance measuring apparatus SRM12 manufactured by Nagy was 0.965Ω. The results are shown in Table 1.

Of the protective plate in Example 2, the luminous transmittance (stimulus Y stipulated in JIS Z8701) measured by color analyzer TC1800 manufactured by Tokyo Denshoku co., Ltd. was 62.6%, and the luminous reflectance was 1.92%. Further, the transmittance at a wavelength of 850 nm was 0.51%. The results are shown in Table 2. The reflection spectrum and the transmission spectrum of this protective plate are shown in FIGS. 6 and 7, respectively.

Comparative Example 1

An electroconductive laminate and a protective plate were obtained in the same manner as in Example 1 except that the electroconductive laminate was prepared as follows.

First, dry cleaning by ion beams was carried out as follows for the purpose of cleaning the surface of a PET film with a thickness of 100 μm as a substrate. First, about 30% of oxygen was mixed with an argon gas, and an electric power of 100 W was charged, and argon ions and oxygen ions ionized by an ion beam source were applied to the surface of the substrate.

Then, on the surface of the substrate to which dry cleaning treatment was applied, pulse sputtering was carried out using a zinc oxide target doped with 5 mass % of alumina by introducing a gas mixture of an argon gas and 3 vol % of an oxygen gas, under a pressure of 0.35 Pa at a frequency of 100 kHz at an electric power density of 5.8 W/cm² with a reverse pulse duration of 1 μs to form an oxide layer a with a thickness of 40 nm.

Then, pulse sputtering was carried out using a silver alloy target doped with 1.0 mass % of gold by introducing an argon gas, under a pressure of 0.5 Pa at a frequency of 100 kHz at an electric power density of 0.6 W/cm² with a reverse pulse duration of 5 μs to form a metal layer with a thickness of 9 nm.

Then, pulse sputtering was carried out using a zinc oxide target doped with 5 mass % of alumina by introducing a gas mixture of an argon gas and 3 vol % of an oxygen gas, under a pressure of 0.35 Pa at a frequency of 100 kHz at an electric power density of 5.8 W/cm² with a reverse pulse duration of 1 us to form an oxide layer with a thickness of 80 nm.

Then, pulse sputtering was carried out using a silver alloy target doped with 1.0 mass % of gold by introducing an argon gas, under a pressure of 0.5 Pa at a frequency of 100 kHz at an electric power density of 0.9 W/cm² with a reverse pulse duration of 5 μs to form a metal layer with a thickness of 11 nm.

Then, pulse sputtering was carried out using a zinc oxide target doped with 5 mass % of alumina by introducing a gas mixture of argon and 3% of an oxygen gas, under a pressure of 0.35 Pa at a frequency of 100 kHz at an electric power density of 5.8 W/cm² with a reverse pulse duration of 1 μs to form an oxide layer with a thickness of 80 nm.

Then, pulse sputtering was carried out using a silver alloy target doped with 1.0 mass % of gold by introducing an argon gas, under a pressure of 0.5 Pa at a frequency of 100 kHz at an electric power density of 1.0 W/cm² with a reverse pulse duration of 5 μs to form a metal layer with a thickness of 13 nm.

Then, pulse sputtering was carried out using a zinc oxide target doped with 5 mass % of alumina by introducing a gas mixture of argon and 3% of an oxygen gas, under a pressure of 0.35 Pa at a frequency of 100 kHz at an electric power density of 5.8 W/cm² with a reverse pulse duration of 1 μs to form an oxide layer with a thickness of 80 nm.

Then, pulse sputtering was carried out using a silver alloy target doped with 1.0 mass % of gold by introducing an argon gas, under a pressure of 0.5 Pa at a frequency of 100 kHz at an electric power density of 1.0 W/cm² with a reverse pulse duration of 5 μs to form a metal layer with a thickness of 13 nm.

Then, pulse sputtering was carried out using a zinc oxide target doped with 5 mass % of alumina by introducing a gas mixture of argon and 3% of an oxygen gas, under a pressure of 0.35 Pa at a frequency of 100 kHz at an electric power density of 5.8 W/cm² with a reverse pulse duration of 1 μs to form an oxide layer with a thickness of 80 nm.

Then, pulse sputtering was carried out using a silver alloy target doped with 1.0 mass % of gold by introducing an argon gas, under a pressure of 0.5 Pa at a frequency of 100 kHz at an electric power density of 0.9 W/cm² with a reverse pulse duration of 5 μs to form a metal layer with a thickness of 11 nm.

Then, pulse sputtering was carried out using a zinc is oxide target doped with 5 mass % of alumina by introducing a gas mixture of argon and 3% of an oxygen gas, under a pressure of 0.35 Pa at a frequency of 100 kHz at an electric power density of 5.8 W/cm² with a reverse pulse duration of 1 μs to form an oxide layer with a thickness of 80 nm.

Then, pulse sputtering was carried out using a silver alloy target doped with 1.0 mass % of gold by introducing an argon gas, under a pressure of 0.5 Pa at a frequency of 100 kHz at an electric power density of 0.6 W/cm² with a reverse pulse duration of 5 μs to form a metal layer with a thickness of 9 nm.

Then, pulse sputtering was carried out using a zinc oxide target doped with 5 mass % of alumina by introducing a gas mixture of argon and 3% of an oxygen gas, under a pressure of 0.35 Pa at a frequency of 100 kHz at an electric power density of 5.2 W/cm² with a reverse pulse duration of 1 μs to form an oxide layer with a thickness of 35 nm.

Then, on the uppermost oxide layer, pulse sputtering was carried out using an ITO target (indium:tin=90:10, mass ratio) by introducing a gas mixture of argon and 5 vol % of an oxygen gas, under a pressure of 0.35 Pa at a frequency of 100 kHz at an electric power density of 0.5 W/cm² with a reverse pulse duration of 1 μs to form an ITO film with a thickness of 5 nm as a protective film.

In such a manner, an electroconductive laminate comprising the oxide layers made of AZO and the metal layers made of a gold/silver alloy alternately laminated on the substrate, in a number of the oxide layers of 7 and a number of the metal layers of 6, was obtained.

Of the electroconductive laminate in Comparative Example 1, the luminous transmittance (stimulus Y stipulated in JIS Z8701) measured by color analyzer TC1800 manufactured by Tokyo Denshoku co., Ltd. was 59.75%, and the luminous reflectance was 5.79%. Further, the transmittance at a wavelength of 850 nm was 0.5%.

Further, the sheet resistance (surface resistance) measured by eddy current type resistance measuring apparatus SRM12 manufactured by Nagy was 0.957Ω. The results are shown in Table 1.

Of the protective plate in Comparative Example 1, the luminous transmittance (stimulus Y stipulated in JIS Z8701) measured by color analyzer TC1800 manufactured by Tokyo Denshoku co., Ltd. was 60.3%, and the luminous reflectance was 1.98%. Further, the transmittance at a wavelength of 850 nm was 0.28%. The results are shown in Table 2. The reflection spectrum and the transmission spectrum are shown in FIGS. 6 and 7, respectively.

Comparative Example 2

An electroconductive laminate and a protective plate were obtained in the same manner as in Example 1 except that the electroconductive laminate was prepared as follows.

First, dry cleaning by ion beams was carried out as follows for the purpose of cleaning the surface of a PET film as a substrate. First, about 30% of oxygen was mixed with an argon gas, and an electric power of 100 W was charged. Argon ions and oxygen ions ionized by an ion beam source were applied to the surface of the substrate.

Then, on the surface of the substrate to which dry cleaning treatment was applied, pulse sputtering was carried out using a zinc oxide target doped with 5 mass % of alumina by introducing a gas mixture of an argon gas and 3 vol % of an oxygen gas, under a pressure of 0.35 Pa at a frequency of 100 kHz at an electric power density of 5.7 W/cm² with a reverse pulse duration of 1 μs to form an oxide layer with a thickness of 40 nm.

Then, pulse sputtering was carried out using a silver alloy target doped with 1.0 mass % of gold by introducing an argon gas, under a pressure of 0.5 Pa at a frequency of 100 kHz at an electric power density of 0.6 W/cm² with a reverse pulse duration of 5 μs to form a metal layer with a thickness of 13 nm.

Then, pulse sputtering was carried out using a zinc oxide target doped with 5 mass % of alumina by introducing a gas mixture of an argon gas and 3 vol % of an oxygen gas, under a pressure of 0.35 Pa at a frequency of 100 kHz at an electric power density of 4.7 W/cm² with a reverse pulse duration of 1 μs to form an oxide layer with a thickness of 80 nm.

Then, pulse sputtering was carried out using a silver alloy target doped with 1.0 mass % of gold by introducing an argon gas, under a pressure of 0.5 Pa at a frequency of 100 kHz at an electric power density of 0.9 W/cm² with a reverse pulse duration of 5 μs to form a metal layer with a thickness of 16 nm.

Then, pulse sputtering was carried out using a zinc oxide target doped with 5 mass % of alumina by introducing a gas mixture of argon and 3% of an oxygen gas, under a pressure of 0.35 Pa at a frequency of 100 kHz at an electric power density of 4.7 W/cm² with a reverse pulse duration of 1 μs to form an oxide layer with a thickness of 80 nm.

Then, pulse sputtering was carried out using a silver alloy target doped with 1.0 mass % of gold by introducing an argon gas, under a pressure of 0.5 Pa at a frequency of 100 kHz at an electric power density of 1.0 W/cm² with a reverse pulse duration of 5 μs to form a metal layer with a thickness of 16 nm.

Then, pulse sputtering was carried out using a zinc oxide target doped with 5 mass % of alumina by introducing a gas mixture of argon and 3% of an oxygen gas, under a pressure of 0.35 Pa at a frequency of 100 kHz at an electric power density of 4.7 W/cm² with a reverse pulse duration of 1 μs to form an oxide layer with a thickness of 80 nm.

Then, pulse sputtering was carried out using a silver alloy target doped with 1.0 mass % of gold by introducing an argon gas, under a pressure of 0.5 Pa at a frequency of 100 kHz at an electric power density of 0.6 W/cm² with a reverse pulse duration of 5 μs to form a metal layer with a thickness of 13 nm.

Then, pulse sputtering was carried out using a zinc oxide target doped with 5 mass % of alumina by introducing a gas mixture of argon and 3% of an oxygen gas, under a pressure of 0.35 Pa at a frequency of 100 kHz at an electric power density of 5.2 W/cm² with a reverse pulse duration of 1 μs to form an oxide layer with a thickness of 35 nm.

Then, on the uppermost oxide layer, pulse sputtering was carried out using an ITO target (indium:tin=90:10) by introducing a gas mixture of argon and 3 vol % of an oxygen gas, under a pressure of 0.35 Pa at a frequency of 100 kHz at an electric power density of 1.0 W/cm² with a reverse pulse duration of 1 us to form an ITO film with a thickness of 5 nm as a protective film.

In such a manner, an electroconductive laminate comprising the oxide layers made of AZO and the metal layers made of a gold/silver alloy alternately laminated on the substrate, in a number of the oxide layers of 5 and a number of the metal layers of 4, was obtained.

Of the electroconductive laminate in Comparative Example 2, the luminous transmittance (stimulus Y stipulated in JIS Z8701) measured by color analyzer TC1800 manufactured by Tokyo Denshoku co., Ltd. was 60.9%, and the luminous reflectance was 6.85%. Further, the transmittance at a wavelength of 850 nm was 0.40%.

Further, the sheet resistance (surface resistance) measured by eddy current type resistance measuring apparatus SRM12 manufactured by Nagy was 0.981Ω. The results are shown in Table 1.

Of the protective plate in Comparative Example 2, the luminous transmittance (stimulus Y stipulated in JIS Z8701) measured by color analyzer TC1800 manufactured by Tokyo Denshoku co., Ltd. was 61.8%, and the luminous reflectance was 4.22%. Further, the transmittance at a wavelength of 850 nm was 0.27%. The results are shown in Table 2. The reflection spectrum and the transmission spectrum of this protective plate are shown in FIGS. 6 and 7, respectively.

The protective plate in Example 1 wherein the oxide layer contains zinc oxide and titanium oxide as the main components and the metal layer contains a silver alloy as the main component, had a broad transmission/reflection band and was excellent in electrical conductivity and visible light transparency, even thought the number of the metal layers was 4.

On the other hand, the protective plate in Comparative Example 1 wherein the oxide layer contains AZO as the main component and the number of the metal layers is 6, had a low visible light transparency.

The protective plate in Comparative Example 2 wherein the oxide layer contains AZO as the main component and the number of the metal layers is 4 had a narrow transmission/reflection band.

Example 3

An electroconductive laminate shown in FIG. 1 was prepared as follows.

First, dry cleaning by ion beams was carried out as follows for the purpose of cleaning the surface of a PET film with a thickness of 100 μm as a substrate 11. First, about 30% of oxygen was mixed with an argon gas, and an electric power of 100 W was charged. Argon ions and oxygen ions ionized by an ion beam source were applied to the surface of the substrate.

Then, on the surface of the substrate to which the dry cleaning treatment was applied, pulse sputtering was carried out using a mixed target of zinc oxide and titanium oxide (zinc oxide:titanium oxide=85:15 (mass ratio)) by introducing a gas mixture of an argon gas and 15 vol % of an oxygen gas under a pressure of 0.73 Pa at a frequency of 50 kHz at an electric power density of 4.5 W/cm² at a reverse pulse duration of 2 μs to form an oxide layer 12a with a thickness of 40 nm. As measured by Rutherford backscattering spectrometry, in the oxide layer 12a, zinc occupied 85 at % and titanium occupied 15 at % based on the total amount (100 at %) of zinc and titanium. Further, in the oxide layer 12a, zinc occupied 37.0 at %, titanium occupied 6.2 at % and oxygen occupied 56.8 at % based on all atoms (100 at %). As calculated as ZnO and TiO₂, the total amount of oxides was 96.7 mass %.

Then, pulse sputtering was carried out using a silver alloy target doped with 1.0 mass % of gold by introducing an argon gas under a pressure of 0.73 Pa at a frequency of 50 kHz at an electric power density of 2.3 W/cm² with a reverse pulse duration of 10 μs to form a metal layer 12b with a thickness of 10 nm.

Then, pulse sputtering was carried out using a mixed target of zinc oxide and titanium oxide (zinc oxide:titanium oxide=85:15 (mass ratio)) by introducing a gas mixture of an argon gas and 15 vol % of an oxygen gas, under a pressure of 0.73 Pa at a frequency of 50 kHz at an electric power density of 4.5 W/cm² with a reverse pulse duration of 2 μs to form an oxide layer 12a with a thickness of 80 nm.

Then, pulse sputtering was carried out using a silver alloy target doped with 1.0 mass % of gold by introducing an argon gas under a pressure of 0.73 Pa at a frequency of 50 kHz at an electric power density of 2.3 W/cm² with a reverse pulse duration of 10 μs to form a metal layer 12b with a thickness of 14 nm.

Then, pulse sputtering was carried out using a mixed target of zinc oxide and titanium oxide (zinc oxide:titanium oxide=85:15 (mass ratio)) by introducing a gas mixture of an argon gas and 15 vol % of an oxygen gas, under a pressure of 0.73 Pa at a frequency of 50 kHz at an electric power density of 4.5 W/cm² with a reverse pulse duration of 2 μs to form an oxide layer 12a with a thickness of 80 nm.

Then, pulse sputtering was carried out using a silver alloy target doped with 1.0 masse of gold by introducing an argon gas under a pressure of 0.73 Pa at a frequency of 50 kHz at an electric power density of 2.3 W/cm² with a reverse pulse duration of 10 μs to form a metal layer 12b with a thickness of 10 nm.

Then, pulse sputtering was carried out using a mixed target of zinc oxide and titanium oxide (zinc oxide:titanium oxide=85:15 (mass ratio)) by introducing a gas mixture of an argon gas and 15 vol % of an oxygen gas, under a pressure of 0.73 Pa at a frequency of 50 kHz at an electric power density of 4.5 W/cm² with a reverse pulse duration of 2 μs to form an oxide layer 12a with a thickness of 35 nm.

Then, on the uppermost oxide layer 12a, pulse sputtering was carried out using an ITO target (indium:tin=90:10 (mass ratio)) by introducing a gas mixture of argon and 5 vol % of an oxygen gas, under a pressure of 0.35 Pa at a frequency of 100 kHz at an electric power density of 1.3 W/cm² with a reverse pulse duration of 1 μs to form an ITO film with a thickness of 5 nm as a protective film 12d.

In such a manner, an electroconductive laminate comprising the oxide layers 12a containing titanium oxide and zinc oxide as the main components and the metal layers 12b made of a gold/silver alloy alternately laminated on the substrate 11, in a number of the oxide layers of 4 and a number of the metal layers of 3, was obtained.

Of the electroconductive laminate in Example 3, the luminous transmittance (stimulus Y stipulated in JIS Z8701) measured by color analyzer TC1800 manufactured by Tokyo Denshoku co., Ltd. was 77.25%, and the luminous reflectance was 5.07%. Further, the transmittance at a wavelength of 850 nm was 12.3%.

Further, the sheet resistance (surface resistance) measured by eddy current type resistance measuring apparatus SRM12 manufactured by Nagy was 1.815Ω. The results are shown in Table 1.

Using this electroconductive laminate 10, a protective plate 1 shown in FIG. 3 was prepared in the same manner as in Example 1.

Of the protective plate in Example 3, the luminous transmittance (stimulus Y stipulated in JIS Z8701) measured by color analyzer TC1800 manufactured by Tokyo Denshoku co., Ltd. was 76.99%, and the luminous reflectance was 3.45%. Further, the transmittance at a wavelength of 850 nm was 9.6%. The results are shown in Table 2.

Example 4

An electroconductive laminate shown in FIG. 1 was prepared as follows.

First, dry cleaning by ion beams was carried out as follows for the purpose of cleaning the surface of a PET film with a thickness of 100 μm as a substrate 11. First, about 30% of oxygen was mixed with an argon gas, and an electric power of 100 W was charged. Argon ions and oxygen ions ionized by an ion beam source were applied to the surface of the substrate.

Then, on the surface of the substrate to which the dry cleaning treatment was applied, pulse sputtering was carried out using a mixed target of zinc oxide and titanium oxide (zinc oxide:titanium oxide=85:15 (mass ratio)) by introducing a gas mixture of an argon gas and 15 vol % of an oxygen gas under a pressure of 0.73 Pa at a frequency of 50 kHz at an electric power density of 4.5 W/cm$^2$ at a reverse pulse duration of 2 μs to form an oxide layer 12a with a thickness of 40 nm. As measured by Rutherford backscattering spectrometry, in the oxide layer 12a, zinc occupied 85 at % and titanium occupied 15 at % based on the total amount (100 at %) of zinc and titanium. Further, in the oxide layer 12a, zinc occupied 37.0 at %, titanium occupied 6.2 at % and oxygen occupied 56.8 at % based on all atoms (100 at %). As calculated as ZnO and TiO$_2$, the total amount of oxides was 96.7 mass %.

Then, pulse sputtering was carried out using a is silver alloy target doped with 1.0 mass % of gold by introducing an argon gas under a pressure of 0.73 Pa at a frequency of 50 kHz at an electric power density of 2.3 W/cm$^2$ with a reverse pulse duration of 10 μs to form a metal layer 12b with a thickness of 10 nm.

Then, pulse sputtering was carried out using a mixed target of zinc oxide and titanium oxide (zinc oxide:titanium oxide=85:15 (mass ratio)) by introducing a gas mixture of an argon gas and 15 vol % of an oxygen gas, under a pressure of 0.73 Pa at a frequency of 50 kHz at an electric power density of 4.5 W/cm$^2$ with a reverse pulse duration of 2 μs to form an oxide layer 12a with a thickness of 80 nm.

Then, pulse sputtering was carried out using a silver alloy target doped with 1.0 mass % of gold by introducing an argon gas under a pressure of 0.73 Pa at a frequency of 50 kHz at an electric power density of 2.3 W/cm$^2$ with a reverse pulse duration of 10 μs to form a metal layer 12b with a thickness of 14 nm.

Then, pulse sputtering was carried out using a mixed target of zinc oxide and titanium oxide (zinc oxide:titanium oxide=85:15 (mass ratio)) by introducing a gas mixture of an argon gas and 15 vol % of an oxygen gas, under a pressure of 0.73 Pa at a frequency of 50 kHz at an electric power density of 4.5 W/cm$^2$ with a reverse pulse duration of 2 μs to form an oxide layer 12a with a thickness of 80 nm.

Then, pulse sputtering was carried out using a silver alloy target doped with 1.0 masse of gold by introducing an argon gas under a pressure of 0.73 Pa at a frequency of 50 kHz at an electric power density of 2.3 W/cm$^2$ with a reverse pulse duration of 10 μs to form a metal layer 12b with a thickness of 14 nm.

Then, pulse sputtering was carried out using a mixed target of zinc oxide and titanium oxide (zinc oxide:titanium oxide=85:15 (mass ratio)) by introducing a gas mixture of an argon gas and 15 vol % of an oxygen gas, under a pressure of 0.73 Pa at a frequency of 50 kHz at an electric power density of 4.5 W/cm$^2$ with a reverse pulse duration of 2 μs to form an oxide layer 12a with a thickness of 80 nm.

Then, pulse sputtering was carried out using a silver alloy target doped with 1.0 mass % of gold by introducing an argon gas under a pressure of 0.73 Pa at a frequency of 50 kHz at an electric power density of 2.3 W/cm$^2$ with a reverse pulse duration of 10 μs to form a metal layer 12b with a thickness of 10 nm.

Then, pulse sputtering was carried out using a mixed target of zinc oxide and titanium oxide (zinc oxide:titanium oxide=85:15 (mass ratio)) by introducing a gas mixture of an argon gas and 15 vol % of an oxygen gas, under a pressure of 0.73 Pa at a frequency of 50 kHz at an electric power density of 4.5 W/cm$^2$ with a reverse pulse duration of 2 μs to form an oxide layer 12a with a thickness of 35 nm.

Then, on the uppermost oxide layer 12a, pulse sputtering was carried out using an ITO target (indium:tin=90:10 (mass ratio)) by introducing a gas mixture of argon and 5 vol % of oxygen gas, under a pressure of 0.35 Pa at a frequency of 100 kHz at an electric power density of 1.3 W/cm$^2$ with a reverse pulse duration of 1 μs to form an ITO film with a thickness of 5 nm as a protective film 12d.

In such a manner, an electroconductive laminate having the oxide layers 12a containing titanium oxide and zinc oxide as the main components and the metal layers 12b made of a gold/silver alloy alternately laminated on the substrate 11, in a number of the oxide layers of 5 and a number of the metal layers of 4, was obtained.

Of the electroconductive laminate in Example 4, the luminous transmittance (stimulus Y stipulated in JIS Z8701) measured by color analyzer TC1800 manufactured by Tokyo Denshoku co., Ltd. was 67.7%, and the luminous reflectance was 5.88%. Further, the transmittance at a wavelength of 850 nm was 0.78%.

Further, the sheet resistance (surface resistance) measured by eddy current type resistance measuring apparatus SRM12 manufactured by Nagy was 0.968Ω. The results are shown in Table 1.

Using this electroconductive laminate 10, a protective plate 1 shown in FIG. 3 was prepared in the is same manner as in Example 1.

Of the protective plate in Example 4, the luminous transmittance (stimulus Y stipulated in JIS Z8701) measured by color analyzer TC1800 manufactured by Tokyo Denshoku co., Ltd. was 68.0%, and the luminous 20 reflectance was 2.52%. Further, the transmittance at a wavelength of 850 nm was 0.68%. The results are shown in Table 2.

TABLE 1

| Electro-conductive laminate | Ex. 1 | Ex. 2 | Comp. Ex. 1 | Comp. Ex. 2 | Ex. 3 | Ex. 4 |
|---|---|---|---|---|---|---|
| Luminous transmittance (%) | 71.40 | 62.94 | 59.75 | 60.9 | 77.25 | 67.7 |
| Luminous reflectance (%) | 6.50 | 4.96 | 5.79 | 6.85 | 5.07 | 5.88 |

TABLE 1-continued

| Electro-conductive laminate | Ex. 1 | Ex. 2 | Comp. Ex. 1 | Comp. Ex. 2 | Ex. 3 | Ex. 4 |
|---|---|---|---|---|---|---|
| Transmittance at 850 nm (%) | 0.96 | 0.69 | 0.5 | 0.40 | 12.3 | 0.78 |
| Sheet resistance (Ω) | 0.942 | 0.965 | 0.957 | 0.981 | 1.815 | 0.968 |

TABLE 2

| Protective plate | Ex. 1 | Ex. 2 | Comp. Ex. 1 | Comp. Ex. 2 | Ex. 3 | Ex. 4 |
|---|---|---|---|---|---|---|
| Luminous transmittance (%) | 71.5 | 62.6 | 60.3 | 61.8 | 76.99 | 68.0 |
| Luminous reflectance (%) | 1.92 | 1.92 | 1.98 | 4.22 | 3.45 | 2.52 |
| Transmittance at 850 nm (%) | 0.76 | 0.51 | 0.28 | 0.27 | 9.6 | 0.68 |

INDUSTRIAL APPLICABILITY

The electroconductive laminate of the present invention has excellent electrical conductivity (electromagnetic wave shielding properties), visible light transparency and near infrared shielding properties, and when laminated on a support, provides a broad transmission/reflection band, and is thereby useful as an electromagnetic wave shielding film and a protective plate for a plasma display. Further, the electroconductive laminate of the present invention may be used as a transparent electrode of e.g. a liquid crystal display device, a windshield for an automobile, a heat mirror or electromagnetic wave shielding window glass.

The entire disclosures of Japanese Patent Application No. 2004-345877 filed on Nov. 30, 2004 and Japanese Patent Application No. 2005-254907 filed on Sep. 2, 2005 including specifications, claims, drawings and summaries are incorporated herein by reference in their entireties.

What is claimed is:

1. An electroconductive laminate comprising a substrate and an electroconductive film formed on the substrate, wherein the electroconductive film has a multilayer structure having an oxide layer and a metal layer alternately laminated from the substrate side in a total layer number of (2n+1) (wherein n is an integer of at least 1); the oxide layer predominantly comprises zinc oxide and titanium oxide having a refractive index of at least 2.3; the oxide layer has an atomic ratio of titanium to a total amount of titanium and zinc of 15-50 atomic %; and the metal layer predominantly comprises silver or a silver alloy.

2. The electroconductive laminate according to claim 1, wherein two to eight metal layers are provided.

3. The electroconductive laminate according to claim 2, wherein the metal layer is made of pure silver or a silver alloy containing gold and/or bismuth.

4. The electroconductive laminate according to claim 1, wherein the metal layer is made of pure silver or a silver alloy containing gold and/or bismuth.

5. An electromagnetic wave shielding film for a plasma display, which is the electroconductive laminate as defined in any of claim 1, 2, 3 or 4.

6. A protective plate for a plasma display, comprising a support, the electromagnetic wave shielding film for a plasma display as defined in claim 5 formed on the support, and an electrode electrically in contact with the electroconductive film of the electromagnetic wave shielding film for a plasma display.

7. The protective plate for a plasma display according to claim 6, which further comprises an electroconductive mesh film.

8. The electroconductive laminate according to claim 1, wherein the oxide layer has an atomic ratio of titanium to a total amount of titanium and zinc of 20-50 atomic %.

9. A process for producing an electroconductive laminate comprising a substrate and an electroconductive film formed on the substrate, wherein said process comprises:
    (A) forming an oxide layer by sputtering using a mixed target of zinc oxide and titanium oxide having a refractive index of at least 2.3, wherein the oxide layer has an atomic ratio of titanium to a total amount of titanium and zinc of 15-50 atomic %; and
    (B) forming a metal layer by sputtering using a silver target or a silver alloy target, on the surface of the substrate,
    wherein said forming (A) and said forming (B) are repeatedly carried out 2n times (wherein n is an integer of at least 1), and finally the oxide layer is formed by said forming (A) to form the electroconductive film.

10. The process according to claim 9, wherein the oxide layer has an atomic ratio of titanium to a total amount of titanium and zinc of 20-50 atomic %.

* * * * *